United States Patent
Park et al.

(10) Patent No.: US 11,399,445 B2
(45) Date of Patent: Jul. 26, 2022

(54) ELECTRONIC DEVICE HAVING HEAT DISSIPATION FUNCTION

(71) Applicant: LG ELECTRONICS INC., Seoul (KR)

(72) Inventors: Minjae Park, Seoul (KR); SeHyeon Kim, Seoul (KR); BongJun Kim, Seoul (KR); MinWoo Jeong, Seoul (KR); Keunsun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 52 days.

(21) Appl. No.: 16/934,426

(22) Filed: Jul. 21, 2020

(65) Prior Publication Data

US 2021/0076534 A1 Mar. 11, 2021

(30) Foreign Application Priority Data

Sep. 6, 2019 (KR) .................. 10-2019-0110920

(51) Int. Cl.
*H05K 7/20* (2006.01)
*F28F 13/16* (2006.01)

(52) U.S. Cl.
CPC ........ *H05K 7/20009* (2013.01); *F28F 13/16* (2013.01); *H05K 7/20409* (2013.01)

(58) Field of Classification Search
None
See application file for complete search history.

(56) References Cited

U.S. PATENT DOCUMENTS 8,824,142 B2 * 9/2014 Jewell-Larsen ......... G06F 1/203
361/694

FOREIGN PATENT DOCUMENTS

| EP | 2 637 269 | 9/2013 |
| JP | 2013-225701 | 10/2013 |
| KR | 10-1513402 | 4/2015 |
| KR | 10-1708999 | 2/2017 |

OTHER PUBLICATIONS

European Search Report dated Jan. 25, 2021 issued in Application No. 20186445.1.

* cited by examiner

*Primary Examiner* — Mukundbhai G Patel
(74) *Attorney, Agent, or Firm* — KED & Associates LLP (57) ABSTRACT

An electronic device having a heat dissipation function is proposed. The electronic device includes: a heating element (20); a shield can (30) covering the heating element (20) to block electromagnetic waves; and a heat dissipation means (50) provided to be adjacent to the heating element (20) and causing an ionic wind to flow into a shielded space (32) of an inner part of the shield can (30). Here, the heat dissipation means (50) includes: a wire electrode (70) provided to be adjacent to an entrance of the shielded space (32) of the shield can (30) and becoming an emitter electrode; and a power module (80) connected to the wire electrode (70) and applying voltage to the wire electrode (70), wherein the shield can (30) is grounded at the same time of being connected to the power module (80) and becomes a collector electrode.

19 Claims, 7 Drawing Sheets

→ Flow of Neutral air molecules
--→ Drift of Ions

ELECTRONIC DEVICE HAVING HEAT
DISSIPATION FUNCTION

CROSS REFERENCE TO RELATED
APPLICATION

The present application claims priority to Korean Patent Application No. 10-2019-0110920, filed Sep. 6, 2019, the entire contents of which is incorporated herein for all purposes by this reference.

BACKGROUND OF THE INVENTION

Field of the Invention

The present disclosure generally relates to an electronic device. More particularly, the present disclosure relates to an electronic device having a heat dissipation function, wherein an ionic wind is used to reduce the temperature of a heating element.

Description of the Related Art

In recent years, with the trend of miniaturization of electronic equipment, the integration density of an electronic device is increasing, and accordingly, heat generated from the electronic equipment is increased. When the heat is not sufficiently discharged to the outside, the performance and lifespan of the electronic equipment may be lowered and the deformation caused by the heat may cause the breakdown of the electronic equipment.

Recently, for example, telematics modules are installed inside a vehicle to use 5G communication service, which is a next generation communication service. Such a communication module is installed inside the vehicle's roof to increase antenna performance. However, although the inside of the roof of the vehicle is easy to be heated by external heat, the inside of the roof is very narrow, so there is a problem that it is difficult to install therein a high-performance heat dissipation means such as a heat dissipation fan.

Recently, a heat dissipation means using an ionic wind has been developed to solve this problem. For example, there are a technology which produces an ionic wind by a potential difference occurring between radially arranged heat-dissipating fins and an electrode mounted to an upper surface of a heat sink, and a technology which increases heat transfer efficiency of a heat sink by generating the ionic wind by using a wire electrode mounted to an upper part of the heat sink.

However, to generate an ionic wind, a discharge electrode (an emitter electrode) and a ground electrode (a collector electrode) are required to be installed in a heat dissipation space, so miniaturization of an electronic device is not easy. Particularly, an electronic device for communication among electronic devices includes a shielding component such as a shield can to prevent radio interference between inner components, so it is further difficult to cause the ionic wind to flow into a sealed space narrowed due to the shielding component.

DOCUMENTS OF RELATED ART (Patent Document 1) Korean Patent No. 10-1708999
(Patent Document 2) Korean Patent No. 10-1513402

SUMMARY OF THE INVENTION

Accordingly, the present disclosure has been made keeping in mind the above problems occurring in the related art, and an objective of the present disclosure is to realize the miniaturization of a heat dissipation means generating an ionic wind.

Another objective of the present disclosure is to provide a heat dissipation means capable of causing an ionic wind to flow into a narrow space shielded by a shielding component.

Still another objective of the present disclosure is to increase cooling efficiency by concentrating an ionic wind on a heating element that generates high temperature heat.

In order to achieve the above objectives, according to one aspect of the present disclosure, there is provided an electronic device having a heat dissipation function, the electronic device including: a heating element; a shield can covering the heating element to block electromagnetic waves; and a heat dissipation means provided to be adjacent to the heating element and causing an ionic wind to flow into a shielded space of an inner part of the shield can. Here, the heat dissipation means includes: a wire electrode installed to be adjacent to an entrance of the shielded space of the shield can and becoming an emitter electrode; and a power module connected to the wire electrode and applying voltage to the wire electrode, wherein the shield can is grounded at the same time of being connected to the power module and becomes a collector electrode such that the ionic wind is generated into the inner part of the shield can. Accordingly, the collector electrode of the emitter electrode and the collector electrode may not be required to be installed as a separate component to generate the ionic wind, so the heat dissipation means may be miniaturized.

In addition, an electrode mounting part of a non-conductive material may be provided at a front of the entrance of the shield can, and the wire electrode, which has a thin and long shape, may be provided in the electrode mounting part in a direction crossing the entrance of the shielded space, so the installation of the wire electrode may be easy.

The electrode mounting part may extend from the entrance of the shield can and may be arch-shaped, and an inlet space of the electrode mounting part may communicate with the shielded space of the shield can to define one heat dissipation space. Particularly, the electrode mounting part may be in close contact with the entrance of the shield can and have the same sectional shape as a sectional shape of the shield can, so the inlet space of the electrode mounting part and the shielded space of the shield can may define the continuous heat dissipation space, which have the same shapes. Accordingly, the ionic wind may further efficiently flow through the heat dissipation space and in the process, may cool a heating means.

The heating element may be mounted to a circuit board, and the shield can may be mounted to the circuit board while covering the heating element and be open to the wire electrode. A heat discharge opening may be provided at an opposite side of the entrance of the shield can and open toward the wire electrode such that the ionic wind passing the heating element is discharged. Such a structure allows a flow path to be created, and an ionic wind may be discharged along the predetermined flow path, so effective heat discharging may be performed.

In addition, the shield can may include: a cover body covering an upper part of the heating element, and mounting legs extending from the cover body and mounted to a circuit board to be grounded, wherein a heat discharge opening open to the outside may be provided in the mounting legs to discharge the ionic wind. That is, the shielded space including the heat discharge opening may be made without significantly altering the structure of an existing shield can.

The wire electrode may be installed at a position inner from an entrance of the electrode mounting part toward the shield can to cross the inlet space of the electrode mounting part. In this case, the wire electrode may be located inside the inlet space, so the risk of electric shock or the possibility of interference with other components may be reduced.

Furthermore, when a height at which the wire electrode is installed is smaller than or the same as a thickness of the heating element, the possibility of interfering with the surface of the heating element may be increased as the ionic wind flows, so effective heat exchange may be performed in the process.

Meanwhile, the wire electrode may be multiply provided in the electrode mounting part to be parallel to each other, or the wire electrode may be multiply provided such that the wire electrodes are installed to be adjacent to at least two surfaces of four surfaces of the shield can, with the shield can disposed therebetween. Accordingly, the multiple wire electrodes may be used to increase the amount of the ionic wind to be generated.

In addition, a connection wire provided in the power module may be connected to the wire electrode and supply power thereto, but the connection wire and the power module may be electrically connected to each other by a pattern of the circuit board to which the shield can is mounted. In this case, a separate connection wire may be omitted.

The electronic device having the heat dissipation function of the present disclosure as described above has the following effects.

In the present disclosure, the heat dissipation means cools the heating element of an electronic device by generating an ionic wind, and the shield can covering the heating element is grounded and becomes a collector electrode. Accordingly, a collector electrode of the emitter electrode and the collector electrode is not required to be installed as a separate component to generate the ionic wind, so the heat dissipation means may be miniaturized.

In addition, the heat dissipation means of the present disclosure can be applied to a structure poor in heat dissipation in which the heating element generating high temperature such as the communication module is provided and the heating element is required to be covered by the shield can to block electromagnetic waves. Accordingly, the heat dissipation means can improve heat dissipation performance by increasing convective heat transfer efficiency. As a result, product performance and durability are improved.

In addition, in the present disclosure, the shield can shielding the heating element becomes a collector electrode for generating the ionic wind, so a distance between the shield can and the emitter electrode (the wire electrode) can be minimized. Accordingly, as the flow distance of the ionic wind increases, the ionic wind flows around the surface of the heating element prior to thickening of a laminar boundary layer. Accordingly, convective heat transfer efficiency can be further increased.

Furthermore, in the present disclosure, the wire electrode, which is the emitter electrode, is installed to cross the entrance of the shield can and can widely dissipate the ionic wind to the inner space of the shield can. Accordingly, convective heat transfer performance can be improved in the shielded space between the heating element and the shield can in which thermal resistance is large but very narrow and in which heat dissipation design is very difficult.

Additionally, the heat dissipation means of the present disclosure is implemented when the wire electrode and the power module alone are mounted to the circuit board. Accordingly, the heat dissipation means can be applied without significantly changing the design of a conventional electronic device, thereby having a high degree of compatibility and design freedom.

In addition, the present disclosure cools the heating element by using the ionic wind generated by an emitter electrode (the wire electrode) and a collector electrode (the shield can), which causes no noise and vibration as compared to a cooling fan operated by a motor. Accordingly, the present disclosure can be applied to various electronic devices requiring low noise/vibration.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION OF THE INVENTION

Hereinbelow, some embodiments of the present disclosure will be described in detail with reference to the accompanying drawings. In adding reference numerals to the components of each drawing, it should be noted that the same reference numerals are assigned to the same components as much as possible even though they are shown in different drawings. In addition, in describing the embodiments of the present disclosure, detailed descriptions of related known configurations or functions are omitted when it is determined that the understanding of the embodiments of the present disclosure is disturbed.

In addition, in describing the components of the embodiments of the present disclosure, terms such as first, second, A, B, a, and b may be used. These terms are only to distinguish the components from other components, and the nature or order, etc. of the components is not limited by the terms. When a component is described as being "connected", "coupled", or "joined" to other components, that component may be directly connected or joined to the other components, and it will be understood that other components between each component may be "connected", "coupled", or "joined" to each other.

The present disclosure relates to an electronic device having a heat dissipation function, and the electronic device of the present disclosure can realize high heat dissipation performance by being applied to a structure in which a heating element 20 generating much heat is provided and heat dissipation is difficult due to the shield can 30 (a shield). To this end, the heat dissipation means 50 of the present disclosure generates an ionic wind, and a collector electrode of an emitter electrode and the collector electrode which generates the ionic wind is not provided as a component, and the shield can 30 itself functions as the collector electrode.

Here, the ionic wind uses movements of ions during corona discharge. The ions generated in a discharge electrode are moved from the emitter electrode (the discharge electrode) to a collector electrode (a ground electrode) by an electric field between the electrodes, that is, by coulomb force. The ions moving in this manner move air molecules in the same direction via the collision with the air molecules, and the movements of the air molecules are joined together and are finally used as a blowing force.

Hereinbelow, the specific structure of the present disclosure will be described by focusing on the heat dissipation means 50 generating the ionic wind.

Figure 1:
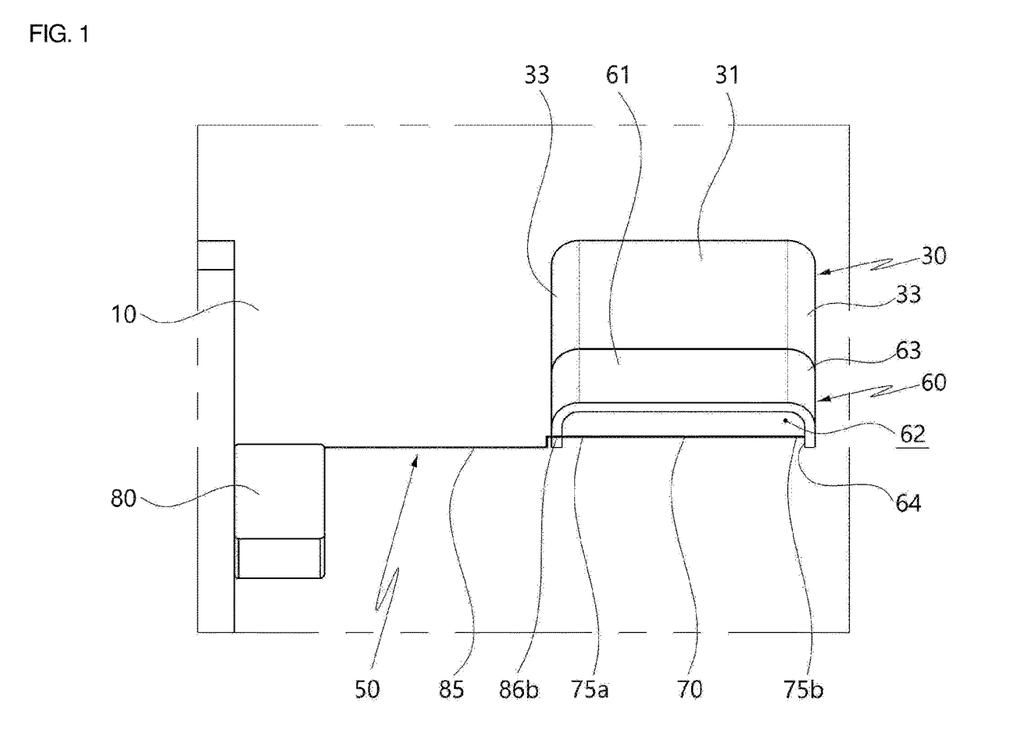
FIG. 1 is a perspective view illustrating a first embodiment of an electronic device having a heat dissipation function according to the present disclosure.
Figure 2:
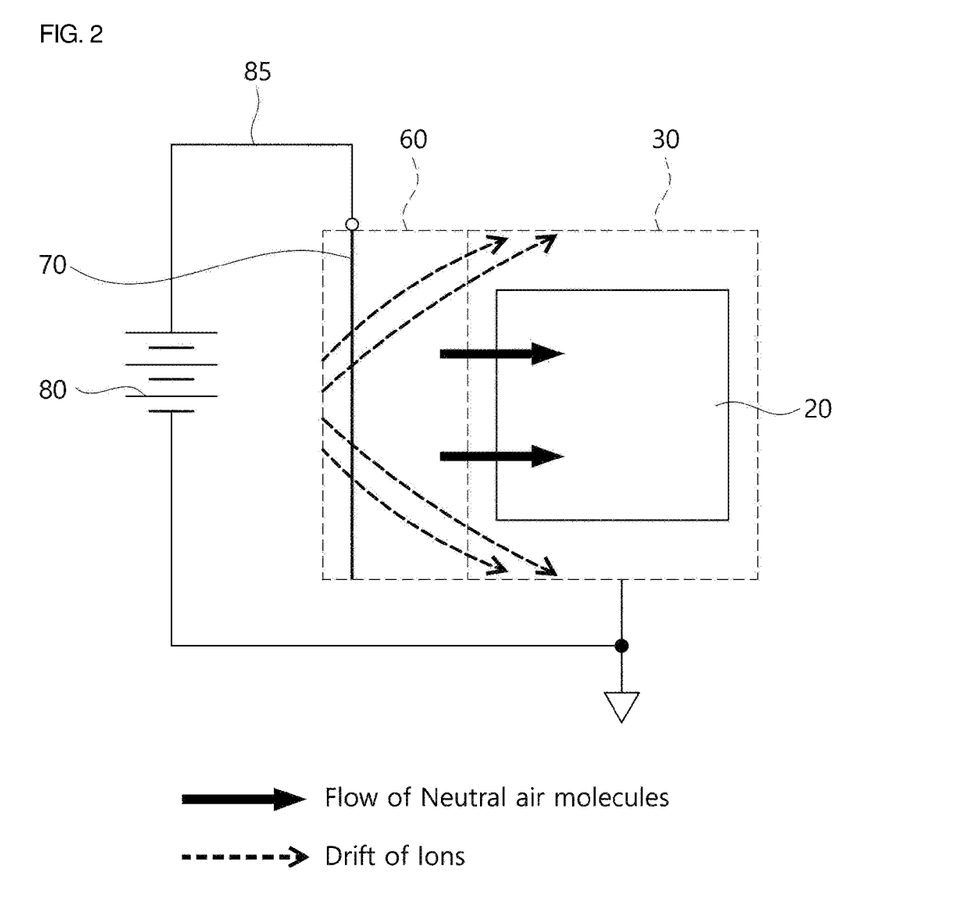
FIG. 2 is a conceptual diagram illustrating circuit configuration for generating an ionic wind in the first embodiment illustrated in FIG. 1.

FIG. 1 is a perspective view illustrating a first embodiment of an electronic device having a heat dissipation function according to the present disclosure, and FIG. 2 is a conceptual diagram illustrating circuit configuration for generating an ionic wind in the first embodiment illustrated in FIG. 1.

FIG. 1 illustrates the structure of a circuit board 10 constituting the electronic device. When the electronic device is a communication module, other components including antennas may be added. The heating element 20 is mounted to the circuit board 10, and the shield can 30 is provided to cover the heating element 20. In FIG. 1, the heating element 20 is not seen due to the shield can 30, and the heating element 20 is seen in FIGS. 3 to 6. Furthermore, an electrode mounting part 60 is provided in a front of the shield can 30, and a power module 80 applying power to a wire electrode 70 mounted to the electrode mounting part 60 is mounted to the circuit board 10.

Referring to FIG. 1, the ionic wind flows into an entrance 62' of an inlet space 62 of the electrode mounting part 60 and flows up to a shielded space 32 (see FIG. 3) defined by the shield can 30 and the circuit board 10. In the process, the heating element 20 is cooled. The ionic wind is generated both by the wire electrode 70 (the emitter electrode) mounted to the electrode mounting part 60 and by the shield can 30 (the collector electrode).

FIG. 2 illustrates a circuit configuration for generating an ionic wind. As illustrated in FIG. 2, the power module 80 generates a high voltage direct current and functions to receive external power and supply the power to the wire electrode 70. In the embodiment, the power module 80 is installed at a side of the circuit board 50 and generates the voltage of 5 kv, and the magnitude of the voltage may change. For reference, in FIG. 2, the shield can 30 and the electrode mounting part 60 are indicated with dotted lines, and the heating element 20 shielded by the shield can 30 is illustrated therewith.

The wire electrode 70 and the shield can 30 are connected to the power module 80. In the embodiment, the wire electrode 70 is connected to a positive electrode of the power module 80, and the shield can 30 is connected to a negative electrode thereof. Furthermore, the shield can 30 is grounded through the circuit board 10. Here, the two electrodes may be reversed and the wire electrode 70 may be the negative electrode. However, when the wire electrode 70 is the negative electrode, ozone generation concentration by corona discharge increases and efficiency is low. Accordingly, the wire electrode is preferably the positive electrode. In this case, a connection wire 85 is provided between the power module 80 and the wire electrode 70, and the power module 80 may be electrically connected to the wire electrode 70.

In this connected state, when a high voltage direct current is applied to the wire electrode 70 by the power module 80, the wire electrode 70 becomes the emitter electrode and the shield can 30 becomes the collector electrode, so that the ionic wind is generated. More particularly, ions generated in the wire electrode 70 by corona discharge are moved from the emitter electrode (the wire electrode 70) to the ground electrode (the shield can 30) by an electric field between the electrodes, that is, by coulomb force. The ions moving in this manner move air molecules in the same direction via the collision with the air molecules, and the movements of the moving air molecules are joined together and finally generate a blowing force.

Accordingly, in the present disclosure, the wire electrode 70, the shield can 30, and the power module 80 constitute the heat dissipation means 50, wherein the heat dissipation means 50 functions to cool the heating element 20 positioned in the shield can 30 by generating the ionic wind. In the embodiment, the heat dissipation means 50 is installed to be adjacent to the heating element 20 and causes the ionic wind to flow into the shielded space 32 of an inner part of the shield can 30. Accordingly, when only the wire electrode 70 and the power module 80 are mounted to the circuit board 10, the heat dissipation means 50 of the present disclosure can be implemented. Accordingly, the heat dissipation means can be applied to a conventional electronic device without significantly changing the design of the conventional electronic device.

Figure 3:
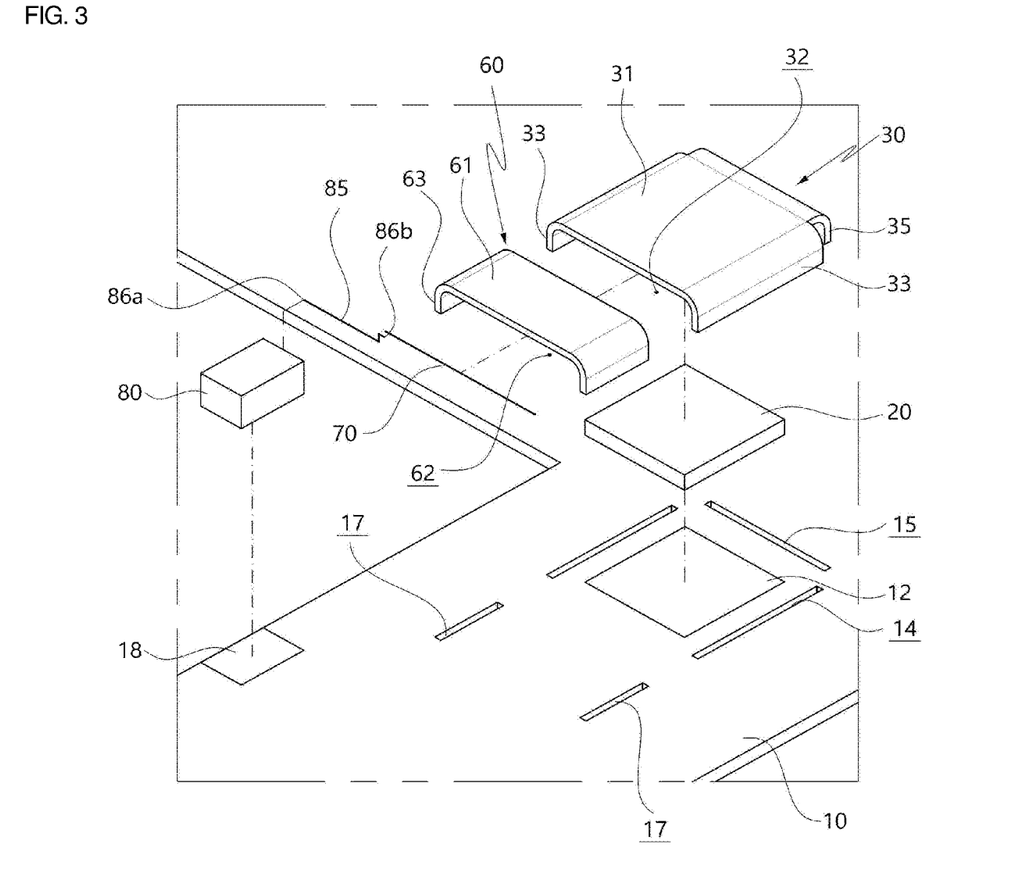
FIG. 3 is an exploded perspective view of components constituting the electronic device illustrated in FIG. 1 according to the first embodiment.

FIG. 3 illustrates an exploded perspective view of components constituting the embodiment of the present disclosure. Accordingly, the heating element 20, the shield can 30, the electrode mounting part 60, and the power module 80, which are described above, are mounted to the circuit board 10. The circuit board 10 includes a heating element seating part 12 on which the heating element 20 sits, wherein multiple shield can mounting holes 14 and 15 are provided by surrounding the vicinity of the heating element seating part 12. Left and right legs 33 and a rear leg 35 of the shield can 30, which will be described below, are fitted into the shield can mounting holes 14 and 15 and grounded. In the embodiment, a total of three shield can mounting holes 14 and 15 are provided, but the number and positions of the shield can mounting holes 14 and 15 may vary according to the structure of the shield can 30.

The circuit board 10 includes electrode mounting holes 17. The electrode mounting part 60 is fitted into the electrode mounting holes 17. In the embodiment, two electrode mounting holes 17 are provided to be spaced apart from each other, and are located in a front of each of the shield can mounting holes 14 and 15, which is described above. When the electrode mounting part 60 is fitted into the electrode mounting holes 17, the electrode mounting part 60 is arranged to be parallel to the shield can 30.

The circuit board 10 includes a power module seating part 18, and the power module 80 is mounted to the power module seating part 18. When the power module 80 is mounted to the power module seating part 18, the power module may be connected to a pattern of the circuit board 10 to receive external power, or may be connected to a separate connector (not shown) to receive external power.

The heating element 20 is mounted to the heating element seating part 12 of the circuit board 10. The heating element 20 may be electrically connected to other components by being mounted to the circuit board 10 and be a part performing various functions, and be covered by the shield can 30. Accordingly, the heating element 20 is covered by the shield can 30 and thus is in a condition fundamentally very disadvantageous in heat dissipation. Here, the heating element 20 may be various components that generate heat by power consumed during operation, such as a communication chip constituting the communication module, a CPU, a microchip, and an IC. In FIG. 3, only one heating element 20 is illustrated, but two or more heating elements may be provided.

The heating element is covered by the shield can 30. The shield can 30 is mounted to the circuit board 10 and covers the heating element 20, and functions to block electromagnetic waves. For such a function of blocking electromagnetic waves, the shield can 30 is made of metal such as stainless steel.

The shield can 30 is mounted to the circuit board 10 by covering the heating element 20, but is not in direct contact with the heating element 20 but is spaced apart by a predetermined distance from the heating element 20. That is, the heating element 20 may be regarded to be located in the shielded space 32 defined between the shield can 30 and the circuit board 10. In the embodiment, a lower surface of the shield can 30 and an upper surface of the heating element 20 are spaced apart from each other, so the ionic wind can flow therebetween.

The shield can 30 is made of a conductive material and, as described above, is electrically connected to the power module 80 and at the same time is grounded to become the collector electrode. Accordingly, the ionic wind can be generated to flow in a direction of the shield can 30 from the wire electrode 70. That is, the shield can 30 itself becomes the collector electrode, without the need for a separate component to make the collector electrode. Accordingly, the ionic wind can be naturally introduced into the narrow shielded space 32.

Referring to the structure of the shield can 30, the shield can 30 includes the cover body 31 covering an upper part of the heating element 20 and mounting legs 33 and 35 mounted to the circuit board 10. The cover body 31 has an approximately flat plate structure and has an area larger than an area of the heating element 20. The cover body 31 and the mounting legs 33 and 35 are configured to be integrated with each other. The mounting legs 33 and 35 extend from edges of the cover body 31 and are fitted into the shield can mounting holes 14 and 15 of the circuit board 10 to be grounded. The mounting legs 33 and 35 may be fixed to the shield can mounting holes 14 and 15 by soldering.

Figure 4:
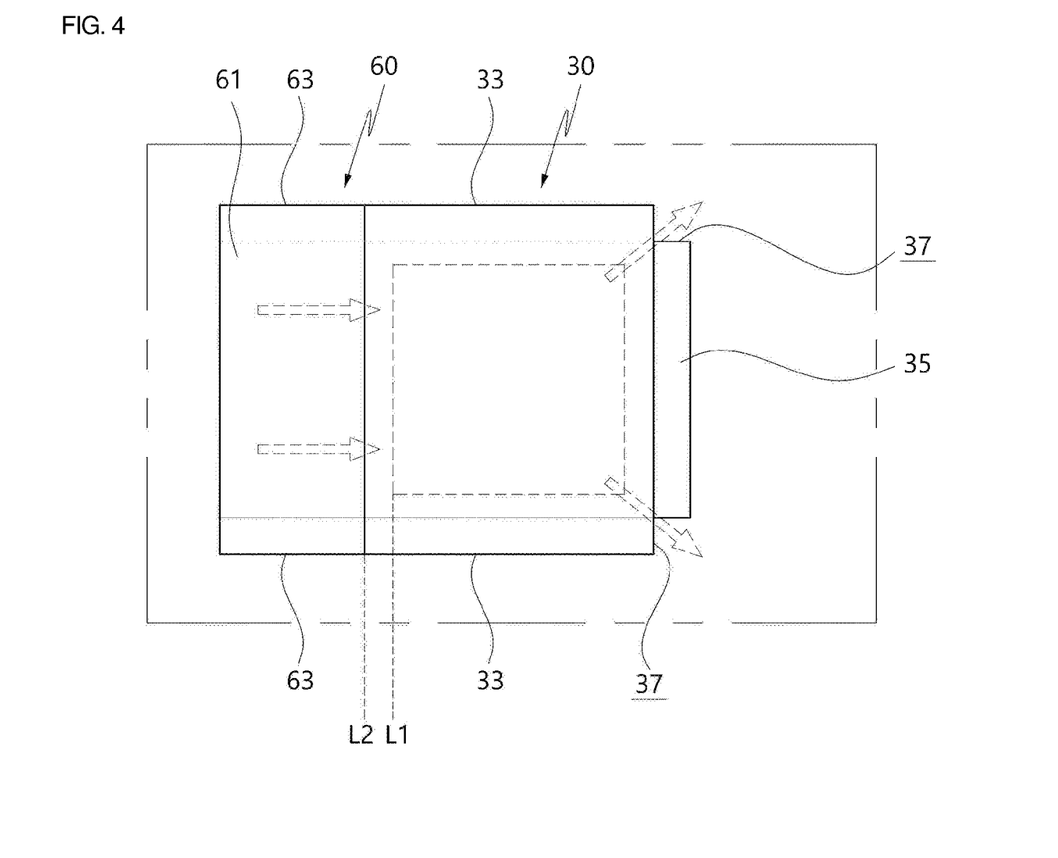
FIG. 4 is a top plan view illustrating the ionic wind flown by the heat dissipation means according to the first embodiment illustrated in FIG. 1.

Referring to FIG. 4, the heating element 20 is located at a position withdrawing from an entrance of the shield can 30 to an opposite side of the wire electrode 70. That is, an end part L2 of a front surface of the cover body 31 of the shield can 30 is closer to the wire electrode 70 than an end part L1 of a front surface of the heating element 20. Due to such a structure, the function of blocking electromagnetic waves of the shield can 30 is sufficiently realized and the ionic wind flowing to the shield can 30 from the wire electrode 70 can pass more surfaces of the heating element 20.

The mounting legs 33 and 35 may be multiply provided. In the embodiment, the mounting legs 33 and 35 include a pair of the left and right legs 33 covering sides of the heating element 20 by being bent from opposite sides of the cover body 31, and the rear leg 35 connecting the left and right legs 33 to each other and covering a rear surface of the heating element 20 by being bent from a rear of the cover body 31. That is, a total of three mounting legs 33 and 35 are provided and cover three surfaces of the vicinity of the heating element 20. Alternatively, the mounting legs 33 and 35 may consist of the left and right legs 33 without the rear leg 35, or may include only any one of the pair of left and right legs 33.

The entrance of a shielded space 32 of the shield can 30 is provided between the mounting legs 33 and 35. The entrance of the shielded space 32 is open in a direction of the wire electrode and functions as an entrance through which the ionic wind is introduced. In the embodiment, the entrance of the shielded space 32 is open toward the electrode mounting part 60 which will be described hereinbelow, and communicates with the inlet space 62 of the electrode mounting part 60. The entrance of the shielded space 32 is preferably open only to the wire electrode 70 such that the ionic wind is introduced only through the entrance of the shielded space 32.

The shield can 30 includes a heat discharge opening 37. The heat discharge opening 37 is a part communicating the shielded space 32 with the outside and may be regarded as a kind of an exit allowing the ionic wind introduced through the entrance of the shielded space 32 to be discharged through the shielded space 32 to the outside. Accordingly, the heat discharge opening 37 is preferably provided at an opposite side of the entrance of the shielded space 32. In the embodiment, the heat discharge opening 37 is provided between the left and right legs 33 and the rear leg 35 since the left and right legs and the rear leg are spaced apart from each other. Of course, alternatively, the heat discharge opening 37 may be provided in a cut portion of each of the left and right legs 33 or the rear leg 35 or may be provided in the form of a heat dissipation hole (not shown) formed through each of the left and right legs 33 or the rear leg 35.

The mounting legs 33 and 35 of the shield can 30 are bent from the cover body 31, and portions at which the cover body 31 and the mounting legs 33 and 35 are connected to each other are extended roundly in a curved shape. That is, each of edges of the cover body 31 of the shield can 30 has a curved surface shape, and the curved surface shape removes dead space in the shielded space 32 such that the ionic wind flows efficiently.

The electrode mounting part 60 is provided in the front of the shield can 30. The electrode mounting part 60 is made of a non-conductive material, and the wire electrode 70 is mounted to the electrode mounting part 60. Since the electrode mounting part 60 is made of a non-conductive material, the electrode mounting part 60 is not electrically connected to the shield can 30 although the electrode mounting part 60 is in contact with the shield can 30. Accordingly, the wire electrode 70 can also be insulated from the shield can 30.

The electrode mounting part 60 is fitted into the electrode mounting holes 17 of the circuit board 10. When the electrode mounting part 60 is fitted into the electrode mounting holes 17, the electrode mounting part 60 is arranged to be parallel to the shield can 30. In the embodiment, the electrode mounting part 60 extends from the entrance of the shield can 30 and is arch-shaped, and the inlet space 62 of the electrode mounting part 60 communicates with the shielded space 32 of the shield can 30. The shielded space 32 and the inlet space 62 define one continuous heat dissipation space 32, 62 and the ionic wind can pass through the heat dissipation space 32, 62.

The electrode mounting part 60 is in close contact with the entrance of the shield can 30, and in the embodiment, the electrode mounting part 60 has the same sectional shape as a sectional shape of the shield can 30, so the inlet space 62 of the electrode mounting part 60 and the shielded space 32 of the shield can 30 may define the continuous heat dissipation space 32, 62, of the same shape. That is, in the embodiment, the arch-shaped section of the electrode mounting part 60 is the same as an arch-shaped section defined by the cover body 31 and the mounting legs 33 and 35 of the shield can 30. Accordingly, the heat dissipation space 32, 62 may be continuously defined such that the ionic wind efficiently flows.

As illustrated in FIG. 1, the electrode mounting part 60 includes the cover plate 61 and fixing legs 63 connected to the cover plate 61. The cover plate 61 has a plate shape; constitutes a roof of the electrode mounting part 60; and is connected to the cover body 31 of the shield can 30. The fixing legs 63 are parts extending from opposite ends of the cover plate 61, and end parts of the fixing legs are fitted into the electrode mounting holes 17 of the circuit board 10. The fixing legs 63 are connected to the left and right legs 33 of the shield can 30 described above. The cover plate 61 and the fixing legs 63 define the inlet space 62 in cooperation with an upper surface of the circuit board 10, and the inlet space 62 communicates with the shielded space 32.

The cover plate 61 and the fixing legs 63 constituting the electrode mounting part 60 are connected to each other to have curved shapes therebetween, so each of edges of the inlet space 62 is rounded. Accordingly, the inlet space 62 prevents dead spaces interfering with the flow of the ionic wind from being defined therein.

In the above embodiment, the electrode mounting part 60 is a part separated from the shield can 30, but may be integral thereto. For example, the electrode mounting part 60 may be made integrally to the shield can 30 by insert injection, or may be made by applying a non-conductive material to some surfaces of the shield can 30.

The wire electrode 70 is mounted to the electrode mounting part 60. The wire electrode 70 constituting the heat dissipation means 50 is installed to be adjacent to the entrance of the shielded space 32 and becomes the emitter electrode. More particularly, the wire electrode 70 is mounted to the electrode mounting part 60, and one end 75a of the wire electrode is connected to one end 86b of the connection wire 85 of the power module 80 such that the wire electrode receives power. Furthermore, the shield can 30 spaced apart from the wire electrode 70 becomes the ground electrode, so the ionic wind is generated in the direction of the shield can 30 from the wire electrode 70.

The wire electrode 70 may be made of a highly conductive material, for example, metal such as tungsten or steel. Unlike the connection wire 85, the conductive material of the wire electrode 70 is exposed to the outside without a sheath and has a thin and long shape in the embodiment.

Figure 5:
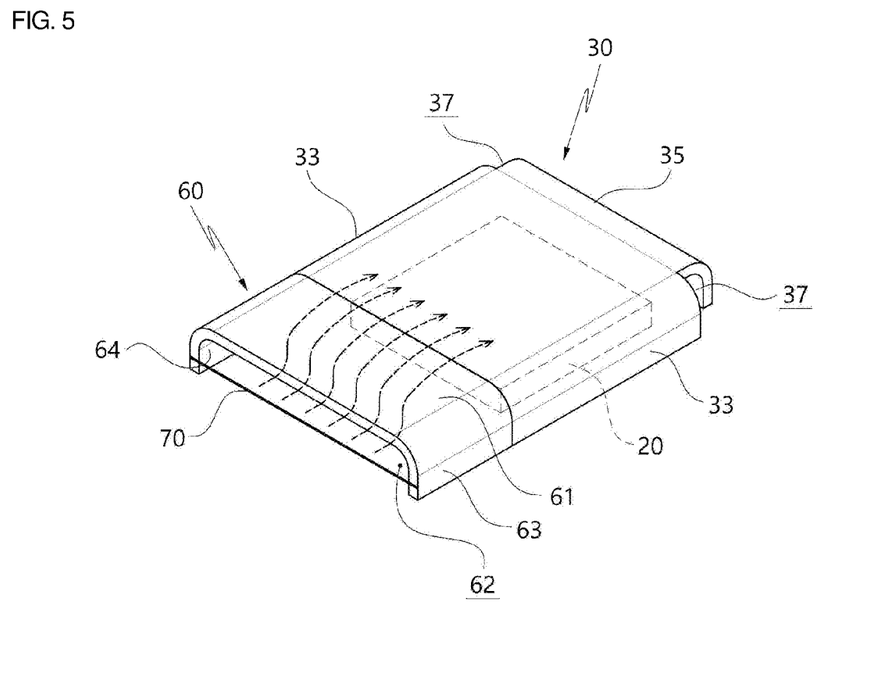
FIG. 5 is a perspective view illustrating the configuration of the heat dissipation means and a heating element cooled by the heat dissipation means illustrated in FIG. 1 according to the first embodiment.

The wire electrode 70 is mounted to the electrode mounting part 60 in a direction crossing the entrance of the shielded space 32 of the shield can 30 from left to right. More particularly, as illustrated in FIG. 5, opposite ends 75a and 75b of the wire electrode 70 are fixed to the fixing legs 63 at opposite sides of the electrode mounting part 60 mounted to the circuit board 10. Accordingly, the wire electrode is installed to cross the inlet space 62 of the electrode mounting part 60 from left to right. Referring to FIGS. 1 and 5, the wire electrode 70 is installed in the direction crossing the entrance of a front surface of the electrode mounting part 60. Accordingly, the wire electrode 70 crosses the entrance of the electrode mounting part 60, which is wide, and so may have length equal to or more than a distance between the opposite fixing legs 63 of the electrode mounting part 60.

In this case, in the embodiment, an area in which the ionic wind is generated is distributed widely so that the ionic wind can be generated in a large area, and the ionic wind can be widely dissipated to the inner space of the shield can 30 by the heat dissipation means 50. Accordingly, convective heat transfer performance can be improved in the shielded space 32 between the heating element 20 and the shield can 30 in which thermal resistance is large but very narrow and in which heat dissipation design is very difficult.

In the embodiment, the wire electrode 70 is mounted to a front surface of each of the fixing legs 63 corresponding to the entrance 62' of the inlet space 62 of the electrode mounting part 60. That is, each of the opposite ends 75a and 75b of the wire electrode 70 is fixed to the front surface of the fixing leg 63, and the end 75a of the wire electrode is connected to an end 86b of the connection wire 85. Accordingly, the wire electrode 70 can generate the ionic wind to an inner side of the inlet space 62 from the entrance thereof.

Alternatively, although not shown, the wire electrode 70 may be installed at a position inner from the entrance of the electrode mounting part 60 toward the shield can 30. In this case, a position at which the ionic wind occurs is at a relatively inner side of the electrode mounting part, and the wire electrode 70 is less exposed to the outside. Accordingly, interference of the wire electrode with other components or the risk of electric shock caused by the wire electrode touching an operator's hand may be reduced.

Figure 6:
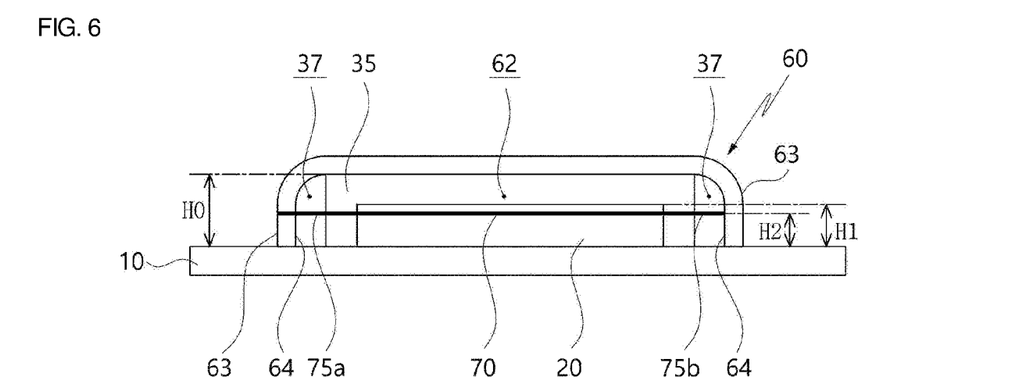
FIG. 6 is a front view of the configuration of the electronic device illustrated in FIG. 1 according to the first embodiment.

Referring to FIG. 6, a height H2 at which the wire electrode 70 is installed is smaller than a thickness H1 of the heating element 20. When the height H2 at which the wire electrode 70 is installed is smaller than the thickness H1 of the heating element 20, the ionic wind generated by the wire electrode 70 does not pass an upper side of the heating element 20, but may flow by passing side surfaces of the heating element 20. Of course, when the height H2 of the wire electrode 70 and a height H0 of the heat dissipation space 32, 62 are low, the ionic wind has the low possibility of passing the upper side of the heating element 20 without passing the side surfaces thereof. When the height H2 of the wire electrode 70 is relatively smaller than the thickness H1 of the heating element 20, the ionic wind can flow more evenly inside the heat dissipation space 32, 62. The height H2 at which the wire electrode 70 is installed may be the same as the thickness H1 of the heating element 20.

In the embodiment, one wire electrode 70 is mounted to the electrode mounting part 60, but multiple wire electrodes may be mounted thereto. For example, the multiple wire electrodes 70 may be mounted to the electrode mounting part 60 to be parallel to each other.

Each of the wire electrodes 70 is connected to the power module 80. The power module 80 is mounted to the circuit board 10 to supply power to the wire electrode 70 through the connection wire 85. The connection wire 85 has one end 86a connected to the power module 80 and the opposite end 86b connected to the wire electrode 70.

The power module 80 may be a part mounted directly to the circuit board 10 or may be a connector structure separable therefrom. Alternatively, the power module 80 may not be mounted to the circuit board 10, but mounted to an outside spaced apart from the circuit board 10. In addition, as illustrated above, the connection wire 85 may be a separate wire, but may also be the pattern of the circuit board 10.

Although not illustrated in FIG. 1, the power module 80 and the shield can 30 are also electrically connected to each other by a ground wire. The wire electrode 70 is connected to the positive electrode of the power module 80, and the shield can 30 is connected to the negative electrode thereof, wherein the shield can 30 is grounded through the circuit board 10. Alternatively, the ground wire may be omitted, and the shield can 30 and the power module 80 may be electrically connected to each other by the pattern of the circuit board 10 to which the shield can 30 is mounted.

Looking at a process in which the ionic wind is generated with reference to FIG. 4, first, when a high voltage direct current is applied to the wire electrode 70 by the power module 80, the wire electrode 70 becomes the emitter electrode and the shield can 30 becomes a collector electrode, so that the ionic wind is generated. More particularly, ions generated in the wire electrode 70 by corona discharge are moved from the emitter electrode (the wire electrode 70) to the ground electrode (the shield can 30) by an electric field between the electrodes, that is, by coulomb force. The ions moving in this manner move air molecules in the same direction (a direction of arrow of FIG. 4) via the collision with the air molecules, and the movements of the moving air molecules are joined together and finally generate a blowing force.

Accordingly, in the present disclosure, the wire electrode 70, the shield can 30, and the power module 80 constitute the heat dissipation means 50, and the heat dissipation means 50 functions to cool the heating element 20 positioned in the shield can 30 by generating the ionic wind. In the embodiment, the heat dissipation means 50 is installed to be adjacent to the heating element 20 and causes the ionic wind to flow into the shielded space 32 of the inner part of the shield can 30.

The ionic wind uses the movements of ions occurring during corona discharge. The ions generated by the discharge electrode are moved from the emitter electrode (a discharge electrode) to the collector electrode (the ground electrode) by an electric field between the electrodes, that is, by coulomb force. The ions moving in this manner move air molecules in the same direction via the collision with the air molecules, and the movements of the air molecules are joined together and are finally used as a blowing force.

Accordingly, the heat dissipation means 50 of the present disclosure can be applied to a structure poor in heat dissipation in which the heating element 20 generating high temperature such as a communication module is provided and the heating element 20 is required to be covered by the shield can 30 to block electromagnetic waves.

Meanwhile, the ionic wind exchanges heat with the heating element 20 via convective heat transfer while passing the heating element 20 in the shielded space 32, and the ionic wind exchanging the heat is discharged through the heat discharge opening 37. Since such a process is performed continuously, the heating element 20 can be cooled. Accordingly, the heat dissipation means 50 of the present disclosure cools the heating element 20 of the electronic device by generating the ionic wind, and the shield can 30 covering the heating element 20 is grounded and becomes the collector electrode. Accordingly, the collector electrode of the emitter electrode and the collector electrode for generating the ionic wind is not required to be installed as a separate component, so the heat dissipation means 50 is miniaturized and causes no noise and vibration as compared to a cooling fan operated by a motor.

In this, in the present disclosure, the collector electrode for generating the ionic wind becomes the shield can 30 shielding the heating element 20, so a distance between the collector electrode and the emitter electrode (the wire electrode 70) can be minimized. Accordingly, as the flow distance of the ionic wind increases, the ionic wind flows around the surface of the heating element 20 prior to thickening of a laminar boundary layer. Accordingly, heat dissipation efficiency can be further increased.

Next, other embodiments of the present disclosure will be described with reference to FIGS. 7A to 10. For reference, the description of the same parts as in the above-described embodiment will be omitted.

Figure 7A:
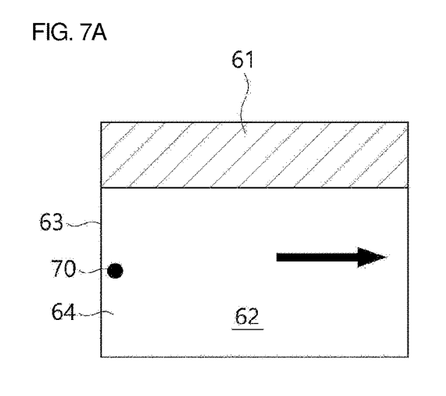
FIGS. 7A and 7B are side sectional views illustrating each of different examples of an electrode mounting part constituting the electronic device having the heat dissipation function according to the present disclosure.
Figure 7B:
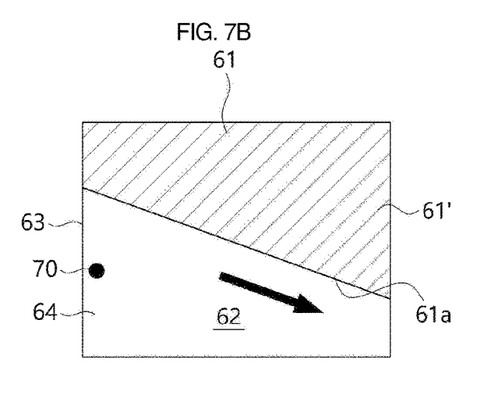

Sectional shapes of the electrode mounting part 60 are illustrated in FIGS. 7A and 7B. Here, each of arrows indicates a direction in which the ionic wind flows. As illustrated in FIG. 7A, the cover plate 61 of the electrode mounting part 60 may have a predetermined thickness, but as illustrated in FIG. 7B, the cover plate may become thicker toward a rear thereof, i.e. toward the shield can 30, and have a sloping surface. Accordingly, the sloping surface 61a may be formed in an inner surface 64 of the electrode mounting part and guide the ionic wind in a direction of the heating element 20.

Figure 8:
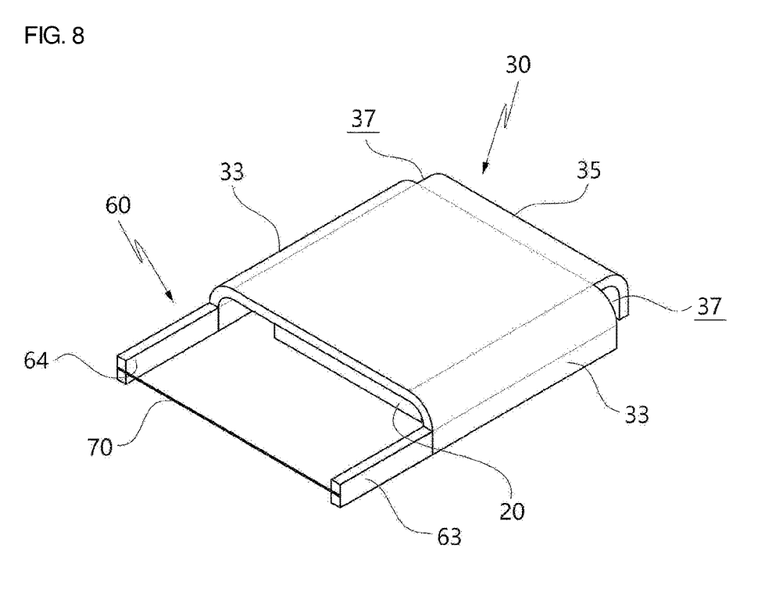
FIG. 8 is a perspective view illustrating a second embodiment of the heat dissipation means constituting the electronic device having the heat dissipation function according to the present disclosure.

FIG. 8 illustrates a second embodiment of the electrode mounting part 60. The cover plate 61 of the previous embodiment may be omitted in the electrode mounting part 60 and the electrode mounting part 60 may consist of only a pair of fixing legs 63 arranged on left and right. The wire electrode may be installed by crossing the fixing legs 63, and an upper part of each of the pair of fixing legs 63 is open. The wire electrode 70 may be installed at the front surface of each of the fixing legs 63 as illustrated in FIG. 8.

In the embodiment illustrated in FIG. 8, an upper part of the electrode mounting part 60 is open, so a portion of the ionic wind may not be introduced to the shielded space 32 but escape to the upper part thereof. However, when the wire electrode 70 is installed at a side of the inner surface 64 of the fixing leg 63 to be located at a position closer to the shield can 30, escaping of the ionic wind can be prevented to some extent. Meanwhile, the electrode mounting part 60 may not be installed as a separate component, but may be a part of the circuit board 10. That is, a part of the circuit board 10 protrudes upward to constitute the electrode mounting part 60, or a pre-installed part may be used as the electrode mounting part 60.

Figure 9:
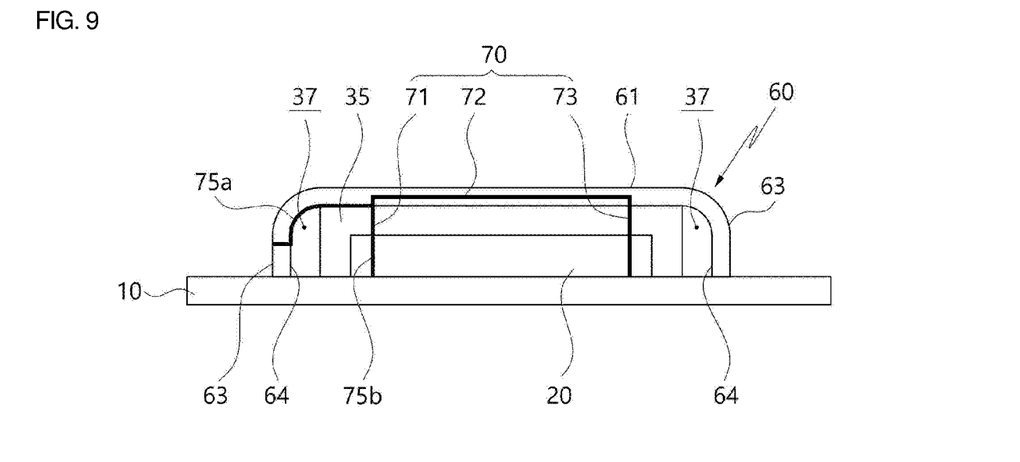
FIG. 9 is a front view illustrating a third embodiment of the heat dissipation means constituting the electronic device having the heat dissipation function according to the present disclosure.

FIG. 9 illustrates a third embodiment of the wire electrode 70. As illustrated herein, the wire electrode 70 may be mounted to the electrode mounting part 60 to extend in upward and downward directions of the shielded space 32 of the shield can 30. In the previous embodiment, the wire electrode 70 is installed in a left to right direction of the shield can 30, that is, by crossing the electrode mounting part 60, but in the embodiment, the wire electrode 70 is installed in the upward and downward directions of the shielded space 32 of the shield can 30.

Referring to FIG. 9, the wire electrode 70 includes a connection electrode connected to the connection wire 85 and two wire electrodes 71 and 73 branching from the connection electrode, which are a first electrode and a second electrode respectively. The first electrode 71 and the second electrode 73 are installed in the upward and downward directions. More particularly, in the electrode mounting part 60, each of the first electrode 71 and the second electrode 73 extends in a direction of an upper surface of the circuit board 10, and is parallel to each other. Each of the first electrode 71 and the second electrode 73 functions as the emitter electrode, and one end part 75b mounted to the upper surface of the circuit board 10 is not electrically connected to the circuit board 10, but is simply mounted thereto.

Accordingly, although the wire electrode 70 extends in the upward and downward directions of the shielded space 32 of the shield can 30, the wire electrode 70 can generate the ionic wind, and as illustrated in FIG. 9, the wire electrode may include two or more electrodes or only one electrode.

Figure 10:
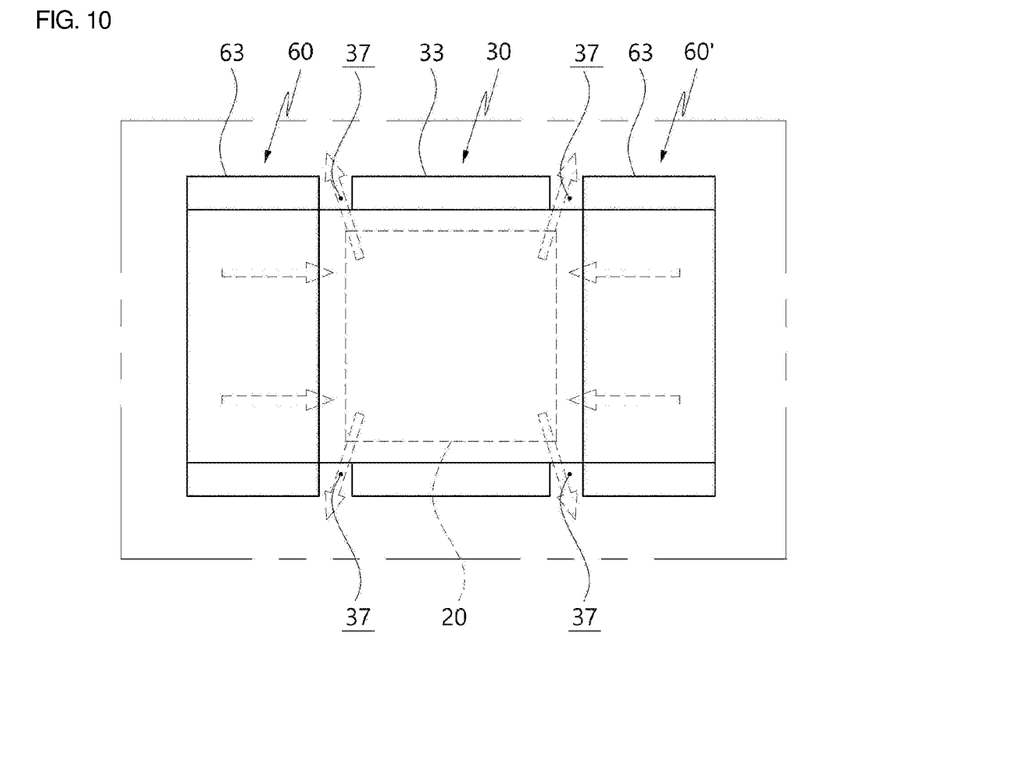
FIG. 10 is a top plan view illustrating a fourth embodiment of the heat dissipation means constituting the electronic device having the heat dissipation function according to the present disclosure.

FIG. 10 illustrates a fourth embodiment of the wire electrode 70 provided multiply. The wire electrodes 70 may be installed to be adjacent to at least two surfaces of four surfaces of the shield can 30, with the shield can 30 disposed therebetween. In the embodiment, each of the wire electrodes 70 is installed at opposite sides of the shield can 30.

As illustrated in FIG. 10, in the embodiment, each of a first electrode mounting part 60 and a second electrode mounting part 60' is provided at the opposite sides of the shield can 30, and a first electrode and a second electrode are mounted to the first electrode mounting part 60 and the second electrode mounting part 60' respectively, which is not illustrated in the drawings. Each of the first electrode and the second electrode becomes the emitter electrode and generates the ionic wind to flow in the direction of the shield can 30. The generated ionic wind is introduced into the shielded space 32 of the shield can 30 and then is discharged through heat discharge openings 37. Each of the heat discharge openings 37 is provided between the shield can 30 and the first electrode mounting part 60, and between the shield can 30 and the second electrode mounting part 60', so the ionic wind can be discharged.

Meanwhile, the heating element 20 and the heat dissipation means 50 are not required to be mounted to the circuit board 10, which is rigid. In the above embodiments, the heating element 20 is mounted to a general rigid printed circuit board 10 as an example, but may be mounted to a flexible printed circuit board (PCB) or mounted directly inside a connector or an electronic device without being mounted to the circuit board 10. In other words, when the heating element 20 and the shield can 30 covering the heating element are provided, the electronic device having a heat dissipation function of the present disclosure can be implemented.

In the above description, the present disclosure is not necessarily limited to these embodiments, although all elements constituting the embodiments according to the present disclosure are described as being combined or operating in combination. That is, within the scope of the present disclosure, all of the components may be selectively combined to operate in one or more. In addition, the terms "include", "constitute", or "having" described above mean that the corresponding component may be inherent unless otherwise stated. Accordingly, it should be construed that other components may be further included instead of being excluded. All terms, including technical and scientific terms, have the same meaning as commonly understood by ones of ordinary skills in the art to which the present disclosure belongs unless otherwise defined. Commonly used terms, such as those defined in a dictionary, should be construed as consistent with the contextual meaning of the related art and shall not be construed in an ideal or excessively formal sense unless explicitly defined in the present disclosure.

The above description is merely illustrative of the technical idea of the present disclosure, and those skilled in the art to which the present disclosure belongs may make various modifications and changes without departing from the essential characteristics of the present disclosure. Accordingly, the embodiments disclosed in the present disclosure are not intended to limit the technical spirit of the present disclosure, but to describe the present disclosure, and the scope of the technical spirit of the present disclosure is not limited by these embodiments. The scope of protection of the present disclosure should be interpreted by the following claims, and all technical ideas within the scope of the present disclosure should be construed as being included in the scope of the present disclosure.

What is claimed is:

1. An electronic device having a heat dissipation function, the electronic device comprising:
    a heating element;
    a shield can covering the heating element to block electromagnetic waves; and
    a heat dissipation means provided to be adjacent to the heating element and causing an ionic wind to flow into a shielded space of an inner part of the shield can,
    wherein the heat dissipation means comprises:
        a wire electrode provided to be adjacent to an entrance of the shielded space and becoming an emitter electrode; and
        a power module connected to the wire electrode and applying voltage to the wire electrode,
        wherein the shield can is grounded at the same time of being connected to the power module and becomes a collector electrode such that the ionic wind is generated into the inner part of the shield can,
        wherein the shield can comprises:
            a cover body covering an upper part of the heating element, and
            mounting legs extending from the cover body and mounted to a circuit board to be grounded,
            wherein a heat discharge opening open to the outside is provided in the mounting legs to discharge the ionic wind.

2. The electronic device of claim 1, wherein an electrode mounting part of a non-conductive material is provided at a front of the entrance of the shield can, wherein the wire electrode is mounted to the electrode mounting part.

3. The electronic device of claim 2, wherein the wire electrode is mounted to the electrode mounting part in a direction crossing the entrance of the shielded space of the shield can from left to right.

4. The electronic device of claim 2, wherein the electrode mounting part extends from the entrance of the shield can and is arch-shaped, and an inlet space of the electrode mounting part communicates with the shielded space of the shield can.

5. The electronic device of claim 2, wherein the electrode mounting part is in close contact with the entrance of the shield can and has the same sectional shape as a sectional shape of the shield can, so an inlet space of the electrode mounting part and the shielded space of the shield can define a continuous heat dissipation space of the same shape.

6. The electronic device of claim 2, wherein opposite ends of the wire electrode are fixed to opposite fixing legs of the electrode mounting part mounted to the circuit board, so the wire electrode is provided to cross an inlet space of the electrode mounting part from left to right.

7. The electronic device of claim 2, wherein the wire electrode is provided at a position inner from an entrance of the electrode mounting part toward the shield can to cross an inlet space of the electrode mounting part.

8. The electronic device of claim 2, wherein a sloping surface is provided on an inner surface of the electrode mounting part and guides the ionic wind in a direction of the heating element.

9. The electronic device of claim 2, wherein the electrode mounting part is configured to be integrated with the shield can or is mounted to a circuit board as a component separated from the shield can at a position adjacent to the shield can.

10. The electronic device of claim 1, wherein the heating element is mounted to the circuit board, and the shield can is mounted to the circuit board while covering the heating element and is open to the wire electrode.

11. The electronic device of claim 1, wherein the heat discharge opening is provided at an opposite side of the entrance of the shield can and is open toward the wire electrode such that the ionic wind passing the heating element is discharged.

12. The electronic device of claim 1, wherein the mounting legs of the shield can comprise:
   a pair of left and right legs covering sides of the heating element by being bent from opposite sides of the cover body; and
   a rear leg connecting the left and right legs to each other and covering a rear surface of the heating element by being bent from a rear of the cover body,
   wherein the left and right legs and the rear leg are spaced apart from each other and the heat discharge opening is provided therebetween.

13. The electronic device of claim 1, wherein a height at which the wire electrode is installed is smaller than or the same as a thickness of the heating element.

14. The electronic device of claim 1, wherein the heating element is located at a position withdrawing from the entrance of the shield can to an opposite side of the wire electrode.

15. The electronic device of claim 1, wherein the wire electrode is multiply provided in the electrode mounting part to be parallel to each other.

16. The electronic device of claim 1, wherein the wire electrode is multiply provided and the wire electrodes are installed to be adjacent to at least two surfaces of four surfaces of the shield can, with the shield can disposed therebetween.

17. An electronic device having a heat dissipation function, the electronic device comprising:
   a heating element mounted to a circuit board;
   a power module mounted to the circuit board;
   a shield can mounted to the circuit board to block electromagnetic waves by covering the heating element and grounded at the same time of being connected to the power module to become a collector electrode; and
   a wire electrode provided to be adjacent to an entrance of a shielded space of the shield can and becoming an emitter electrode when the wire electrode receives power by being connected to the power module such that an ionic wind is generated in a direction of the shield can,
   wherein the shield can comprises:
     a cover body covering an upper part of the heating element, and
     mounting legs extending from the cover body and mounted to the circuit board to be grounded,
     wherein a heat discharge opening open to the outside is provided in the mounting legs to discharge the ionic wind.

18. The electronic device of claim 17, wherein a connection wire provided in the power module is connected to the wire electrode and supplies power thereto, or the connection wire and the power module are electrically connected to each other by a pattern of the circuit board.

19. The electronic device of claim 17, wherein a ground wire is provided in the power module and is electrically connected to the shield can, or the shield can and the power module are electrically connected to each other by a pattern of the circuit board.

* * * * *